United States Patent
Gao et al.

(10) Patent No.: US 8,373,379 B2
(45) Date of Patent: Feb. 12, 2013

(54) METHODS AND DEVICES FOR ESTIMATION OF INDUCTION MOTOR INDUCTANCE PARAMETERS

(75) Inventors: Zhi Gao, Wake Forest, NC (US); Larry A. Turner, Chapel Hill, NC (US); Roy S. Colby, Raleigh, NC (US)

(73) Assignee: Schneider Electric USA, Inc., Palatine, IL (US)

( * ) Notice: Subject to any disclaimer, the term of this patent is extended or adjusted under 35 U.S.C. 154(b) by 301 days.

(21) Appl. No.: 12/909,589

(22) Filed: Oct. 21, 2010

(65) Prior Publication Data

US 2012/0098477 A1    Apr. 26, 2012

(51) Int. Cl.
*H02P 23/00*    (2006.01)
(52) U.S. Cl. ........ 318/798; 318/700; 318/727; 318/807; 318/690; 318/721; 702/60; 702/65
(58) Field of Classification Search .......... 318/798, 318/727, 807, 700, 690, 715, 721, 490, 561, 318/560, 569, 801, 799, 652, 400.27, 616; 702/60, 57, 33, 65, 38; 323/241, 290; 700/286, 700/291
See application file for complete search history.

(56) References Cited

U.S. PATENT DOCUMENTS

| | | | |
|---|---|---|---|
| 5,477,162 A | | 12/1995 | Heikkila |
| 5,565,752 A | * | 10/1996 | Jansen et al. ................. 318/807 |
| 5,661,386 A | | 8/1997 | Kueck et al. |
| 5,689,169 A | | 11/1997 | Kerkman et al. |
| 5,729,113 A | * | 3/1998 | Jansen et al. ................. 318/799 |
| 5,861,728 A | | 1/1999 | Tazawa et al. |
| 5,965,995 A | | 10/1999 | Seibel et al. |
| 6,452,360 B1 | | 9/2002 | Colby |
| 6,636,012 B2 | | 10/2003 | Royak et al. |
| 6,774,664 B2 | | 8/2004 | Godbersen |
| 6,862,538 B2 | | 3/2005 | El-Ibiary |
| 7,135,830 B2 | | 11/2006 | El-Ibiary |
| 7,184,902 B2 | | 2/2007 | El-Ibiary |

(Continued)

FOREIGN PATENT DOCUMENTS

EP    2120326    11/2009

OTHER PUBLICATIONS

Akagi et al., "Instantaneous reactive power compensators comprising switching devices without energy storage components," *IEEE Transaction on Industry Applications*, vol. 1A-20, No. 3, pp. 625-630, May/Jun. 1984.

(Continued)

*Primary Examiner* — Walter Benson
*Assistant Examiner* — Jorge Carrasquillo
(74) *Attorney, Agent, or Firm* — Nixon Peabody LLP

(57) ABSTRACT

Methods and devices are presented herein for estimating induction motor inductance parameters based on instantaneous reactive power. The induction motor inductance parameters, e.g., the stator inductance and the total leakage factor, can be estimated from motor nameplate data and instantaneous reactive power without involving speed sensors or electronic injection circuits. In one embodiment, the method includes: measuring voltages and currents; converting the measured voltages and currents into discrete-time voltage and current samples by analog-to-digital converters; synthesizing a complex voltage from the discrete-time voltage samples; synthesizing a complex current from the discrete-time current samples; acquiring and storing motor nameplate data; detecting instantaneous rotor speed by calculating an instantaneous rotor slot harmonic frequency with respect to an instantaneous fundamental frequency; calculating, via an induction motor inductance estimator, the motor's instantaneous reactive power and other intermediate quantities; and outputting the stator inductance and the total leakage factor.

19 Claims, 6 Drawing Sheets

U.S. PATENT DOCUMENTS

| | | | |
|---|---|---|---|
| 7,570,074 B2 | 8/2009 | Gao et al. | |
| 2003/0071596 A1* | 4/2003 | Gokhale et al. | 318/727 |
| 2004/0019439 A1* | 1/2004 | El-Ibiary | 702/57 |
| 2009/0284204 A1 | 11/2009 | Colby et al. | |
| 2009/0284211 A1* | 11/2009 | Gao et al. | 318/727 |
| 2009/0284212 A1 | 11/2009 | Turner et al. | |

OTHER PUBLICATIONS

Cirrincione et al., "A new experimental application of least-squares techniques for the estimation of the induction motor parameters," *IEEE Transactions on Industry Applications*, vol. 39, No. 5, pp. 1247-1256, Sep./Oct. 2003.

Gao et al., "A sensorless rotor temperature estimator for induction machines based on a current harmonic spectral estimation scheme," *IEEE Transactions on Industrial Electronics*, vol. 55, No. 1, pp. 407-416, Jan. 2008.

Gao et al., "A complex space vector approach to rotor temperature estimation for line-connected induction machines with impaired cooling", *IEEE Transactions on Industrial Electronics*, vol. 56, No. 1, pp. 239-247, Jan. 2009.

Gao et al., "Narrowband angle modulations in induction motor complex current vectors", in *Proceedings of the 7th IEEE International Symposium on Diagnostics for Electric Machines, Power Electronics and Drives*, Cargèse, France, Aug. 31-Sep. 3, 2009.

Lu et al., "A nonintrusive and in-service motor-efficiency estimation method using air-gap torque with considerations of condition monitoring", *IEEE Transactions on Industry Applications*, vol. 44, No. 6, pp. 1666-1674, Nov./Dec. 2008.

Oppenheim et al., *Discrete-Time Signal Processing*, 2$^{nd}$ ed. Upper Saddle River, NJ: Prentice-Hall, 1999, pp. 347-348.

Peng et al., "Generalized instantaneous reactive power theory for three-phase power systems," *IEEE Transactions on Instrumentation and Measurement*, vol. 45, No. 1, pp. 293-297, Feb. 1996.

Ribeiro et al., "Parameter sensitivity of MRAC models employed in IFO-Controlled AC motor drive," *IEEE Transactions on Industrial Electronics*, vol. 44, No. 4, pp. 536-545, Aug. 1997.

Stephan et al., "Real-time estimation of the parameters and fluxes of induction motors", *IEEE Transactions on Industry Applications*, vol. 30, No. 3, May/Jun. 1994.

Willems, "A new interpretation of the Akagi-Nabae power components for nonsinusoidal three-phase situations," *IEEE Transactions on Instrumentation and Measurement*, vol. 41, No. 4, pp. 523-527, Aug. 1992.

International Search Report mailed May 4, 2012 issued in corresponding International Patent Application No. PCT/US2011/056487 (4 pages).

Written Opinion mailed May 4, 2012 issued in corresponding International Patent Application No. PCT/US2011/056487 (4 pages).

* cited by examiner

METHODS AND DEVICES FOR ESTIMATION OF INDUCTION MOTOR INDUCTANCE PARAMETERS

FIELD OF THE INVENTION

The present disclosure relates generally to induction motors, and more particularly to the estimation of inductance parameters for polyphase induction motors in the absence of speed sensors and electronic injection circuits.

BACKGROUND

Squirrel-cage induction motors are widely used in the agricultural, commercial, municipal, and residential sectors due to their high energy efficiency, reliability, and good controllability. As induction motors become more involved in critical tasks, such as heating, ventilating, and air conditioning (HVAC) systems used in places like hospital intensive-care units (ICU) and energy-efficient buildings, accurate and reliable condition monitoring of their status is assuming a greater importance. An important part of this condition monitoring task involves an accurate estimation of the induction motor inductance parameters, such as the stator inductance and the total leakage factor.

To obtain inductance parameters for an induction motor without interrupting normal motor operations, online and noninvasive inductance parameter estimation methods are typically in practice. Such methods estimate an in-service induction motor's stator inductance and total leakage factor based on the voltage and current measurements acquired at motor terminals or at motor control centers. There are various known methods for inductance parameter estimation for inverter-fed motors (i.e., motors that are connected to ac drives). Some such methods involve injecting certain signals into the motor, which require separate electronic circuits be inserted between the power supply and the motor. Although reasonably accurate estimates of induction motor inductance parameters are obtainable, it is rather impractical to implement these methods for line-connected motors, as these motors are connected directly to their power supplies, and normally there is no room for separate electronic circuits.

There are currently two primary approaches for obtaining inductance parameters in an online and noninvasive manner for line-connected induction motors. The first approach is based on the steady-state induction motor equivalent circuit model. By collecting voltage and current measurements from a line-connected induction motor operated at multiple distinct load levels, these methods estimate the induction motor electrical parameters, including inductance parameters, without actually stopping the motor. To simplify the estimation process, an assumption is made on the ratio of the stator leakage inductance to the magnetizing inductance. This approach may not work well for line-connected motors under dynamic motor operations, such as motors connected to time-varying loads like reciprocating compressors or pumps.

The second approach is based on the dynamic induction motor equivalent circuit model. This approach estimates the induction motor electrical parameters, including inductance parameters, by computing a least-squares solution. This technique requires an accurate knowledge of the instantaneous rotor speed. The rotor speed is obtained from an external speed sensor attached to the shaft of the motor. Such speed sensors are costly and fragile, and are very difficult to install in many motor applications.

SUMMARY

In view of the foregoing deficiencies in the prior art, an alternative approach to obtaining inductance parameters for line-connected squirrel-cage induction motors is presented herein. It is desirable, in some applications, to estimate induction motor inductance parameters based on the motor's inherent magnetic saliency. For the purpose of high-precision condition monitoring, diagnosis, and protection applications, such as real-time rotor temperature tracking, it can be desirable to produce real-time high-precision estimates of induction motor inductance parameters without speed sensors. For example, in some applications, the inductance parameters are estimated from only motor nameplate data and the instantaneous reactive power, which is derived from the voltage and current measurements. The instantaneous reactive power is related to the induction motor inductance parameters.

According to one aspect of the present disclosure, a method is presented for estimating at least one motor inductance parameter of a polyphase induction motor. The method includes: receiving measurements indicative of at least one voltage and at least one current associated with the induction motor; converting the voltage measurements to discrete-time voltage samples and the current measurements to discrete-time current samples; determining a complex voltage from the discrete-time voltage samples and a complex current from the discrete-time current samples; receiving motor nameplate data associated with the motor; determining an instantaneous rotor speed of the motor; determining an instantaneous reactive power of the induction motor according to a function that includes the complex voltage and the complex current; determining at least one motor inductance parameter based, at least in part, upon the motor nameplate data and the instantaneous reactive power; and storing an indication of the at least one motor inductance parameter.

In accordance with yet another aspect of the present disclosure, a method is presented for estimating one or more inductance parameters of a line-connected squirrel-cage polyphase induction motor. The method includes: measuring voltages and currents of the induction motor; converting, via analog-to-digital converters, the measured voltages and currents to discrete-time voltage samples and discrete-time current samples, respectively; synthesizing a complex voltage from at least the discrete-time voltage samples; synthesizing a complex current from at least the discrete-time current samples; acquiring motor nameplate data; storing the acquired motor nameplate data; detecting an instantaneous rotor speed by calculating an instantaneous rotor slot harmonic frequency with respect to an instantaneous fundamental frequency; calculating, via an induction motor inductance estimator, an instantaneous reactive power and a plurality of intermediate quantities of the induction motor; and storing a stator inductance and a total leakage factor of the induction motor.

In accordance with another aspect of the present disclosure, one or more machine-readable non-transitory storage media are encoded with instructions which, when executed by one or more processors, cause the one or more processors to perform any of the above or below methods.

The above summary is not intended to represent each embodiment or every aspect of the present disclosure. Rather, the foregoing summary merely provides an exemplification of some of the novel features included herein. The above features and advantages, and other features and advantages of the present disclosure, will be readily apparent from the following detailed description of the embodiments and best modes for carrying out the present invention when taken in connection with the accompanying drawings and appended claims.

Figure 1:
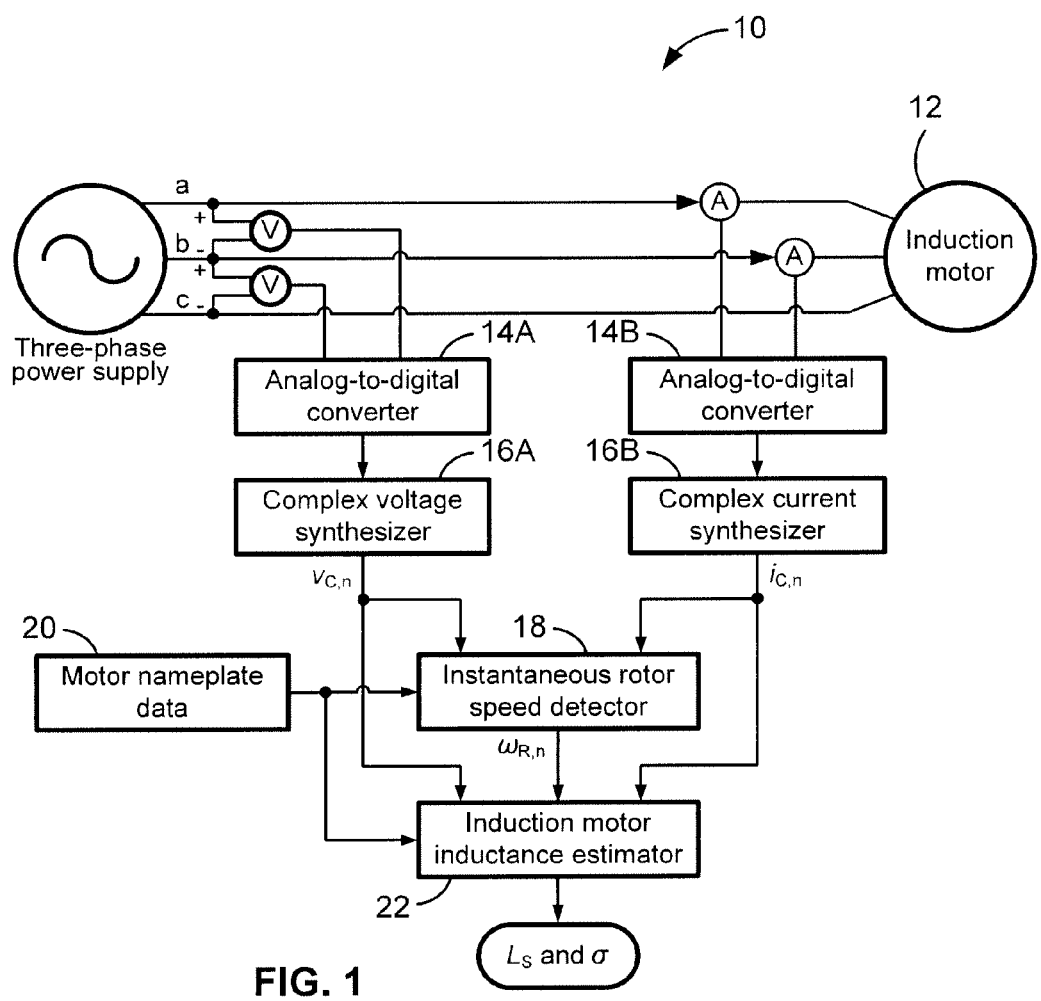
FIG. 1 is a schematic block diagram showing the overall architecture of an exemplary apparatus for estimating inductance parameters of an induction motor.

While the present disclosure is susceptible to various modifications and alternative forms, specific embodiments have been shown by way of example in the drawings and will be described in detail herein. It should be understood, however, that the disclosure is not intended to be limited to the particular forms disclosed. Rather, the invention is to cover all modifications, equivalents, and alternatives falling within the spirit and scope of the invention as defined by the appended claims.

DETAILED DESCRIPTION

While the present disclosure is susceptible of embodiment in many different forms, there are shown in the drawings and will herein be described in detail representative embodiments of the invention with the understanding that the present disclosure is to be considered as an exemplification of the various aspects and principles of the invention, and is not intended to limit the broad aspect of the invention to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference or otherwise.

The present disclosure is directed to the estimation of inductance parameters for induction motors in the absence of speed sensors and/or electronic injection circuits. In some embodiments, methods and devices are presented for estimating the inductance parameters for line-connected squirrel-cage polyphase induction motors operated at either steady-state or dynamic conditions without using any speed sensors or electronic injection circuits. The inductance parameters are estimated from motor nameplate data and instantaneous reactive power that is derived, for example, from voltage and current measurements. The induction motor inductance parameters, e.g., the stator inductance and the total leakage factor, can be determined from the measurements acquired during dynamic or steady-state motor operations. Speed sensors or electronic circuits are not needed, and thus this approach is suitable for various line-connected motor applications. By using the instantaneous reactive power as an intermediate quantity in the estimation process, induction motor inductance estimation is decoupled from the induction motor resistance estimation. Consequently, high-precision estimation results are obtained for induction motor inductance parameters.

Referring now to the drawings, wherein like reference numerals refer to like components throughout the several views, FIG. 1 is a schematic block diagram showing the overall architecture of an exemplary device or apparatus, designated generally as 10, for estimating the inductance parameters of an induction motor, schematically illustrated at 12. In the illustrated embodiment, there are five primary stages: (1) voltage and current measurements are taken, for example, with analog-to-digital converters 14A and 14B; (2) complex voltage and complex current are generated, for example, by respective synthesizers 16A and 16B; (3) instantaneous rotor speed is detected, for example, by an instantaneous rotor speed detector 18; (4) motor nameplate data are acquired and stored in memory 20; and (5) the motor's instantaneous reactive power and inductance parameters, such as the stator inductance and the total leakage factor, are calculated by an induction motor inductance estimator 22.

Voltage and Current Measurements

For a line-connected polyphase induction motor with a floating neutral point, the first and second analog-to-digital converters 14A, 14B are operable to convert voltage and current waveforms, respectively, which can be measured among different phases, to discrete-time voltage and current samples at a sampling frequency $f_S$, which is measured in hertz (Hz). For example, FIG. 1 shows that two voltage samples, $v_{ab,n}$ and $v_{bc,n}$, are acquired along with two current samples, $i_{a,n}$ and $i_{b,n}$. The subscript "n" denotes a temporal index, i.e., the nth sample, in a discrete-time system. In some embodiments, the voltages are typically measured either from two phases with respect to a third phase, or from two phases with respect to an arbitrary voltage reference point determined by the measurement device. The currents are typically measured either from two phases or from all three phases.

Complex Voltage and Complex Current

A complex voltage $v_{C,n}$, which is measured in volts (V), is synthesized from the acquired discrete-time voltage samples via complex voltage synthesizer 16A. It is a sequence of complex numbers carrying frequency information between $-f_S/2$ and $f_S/2$. Similarly, a complex current $i_{C,n}$, which is measured in amperes or amps (A), is synthesized from the acquired discrete-time current samples via complex current synthesizer 16B. The complex voltage $v_{C,n}$ and current $i_{C,n}$ represent an induction motor's operating condition.

Complex Voltage Synthesizer

In some embodiments, the complex voltage $v_{C,n}$ is synthesized from the acquired voltage samples by a complex voltage synthesizer 16A. Table I (below) shows the detailed relationship between the complex voltage synthesizer's input and output. In Table I, acquired voltage samples are denoted by a symbol X. The quantity $\alpha = \exp(j \cdot 2\pi/3)$ is a constant; j is the imaginary unit; $\exp(\cdot)$ denotes an exponential function; $v_{ab,n}$ denotes the voltage of phase a with respect to phase b; $v_{bc,n}$ denotes the voltage of phase b with respect to phase c; $v_{ca,n}$ denotes the voltage of phase c with respect to phase a. The subscript o denotes an arbitrary voltage reference point selected by the measurement device. For example, given two acquired voltage samples $v_{ab,n}$ and $v_{bc,n}$, the complex voltage $v_{C,n}$ is synthesized by $v_{C,n} = \frac{2}{3} \cdot (v_{ab,n} - \alpha^2 \cdot v_{bc,n})$ according to Case 1 in Table I. Alternative quantities may be measured and converted in a similar fashion.

TABLE I

Complex Voltage Synthesizer

| | Input | | | | | | Output |
|---|---|---|---|---|---|---|---|
| Case | $v_{ab,n}$ | $v_{bc,n}$ | $v_{ca,n}$ | $v_{ao,n}$ | $v_{bo,n}$ | $v_{co,n}$ | |
| 1 | X | X | | | | | $v_{C,n} = \frac{2}{3} \cdot (v_{ab,n} - \alpha^2 \cdot v_{bc,n})$ |
| 2 | | X | X | | | | $v_{C,n} = \frac{2}{3} \cdot (\alpha \cdot v_{bc,n} - v_{ca,n})$ |
| 3 | X | | X | | | | $v_{C,n} = \frac{2}{3} \cdot (-\alpha \cdot v_{ab,n} + \alpha^2 \cdot v_{ca,n})$ |
| 4 | | | | X | X | X | $v_{C,n} = \frac{2}{3} \cdot (v_{ao,n} + \alpha \cdot v_{bo,n} + \alpha^2 \cdot v_{co,n})$ |

Complex Current Synthesizer

In some embodiments, the complex current $i_{C,n}$ is synthesized from the acquired current samples by a complex current synthesizer. Table II (below) shows the detailed relationship between the complex current synthesizer's input and output. Similar to the notation used above in Table I, acquired current samples are denoted by the symbol X in Table II. Phase a, b and c current samples are denoted by $i_{a,n}$, $i_{b,n}$, and $i_{c,n}$, respectively. For example, given two acquired current samples $i_{a,n}$ and $i_{b,n}$, the complex current $i_{C,n}$ is synthesized by $i_{C,n} = \frac{2}{3} \cdot [(2+\alpha) \cdot i_{a,n} + (1+2\alpha) \cdot i_{b,n}]$ according to Case 1 in Table II. Alternative quantities may be measured and converted in a similar fashion.

TABLE II

Complex Current Synthesizer

| | Input | | | Output |
|---|---|---|---|---|
| Case | $i_{a,n}$ | $i_{b,n}$ | $i_{c,n}$ | |
| 1 | X | X | | $i_{C,n} = \frac{2}{3} \cdot [(2+\alpha) \cdot i_{a,n} + (1+2\alpha) \cdot i_{b,n}]$ |
| 2 | | X | X | $i_{C,n} = \frac{2}{3} \cdot [(-1+\alpha) \cdot i_{b,n} + (-2-\alpha) \cdot i_{c,n}]$ |
| 3 | X | | X | $i_{C,n} = \frac{2}{3} \cdot [(1-\alpha) \cdot i_{a,n} + (-1-2\alpha) \cdot i_{c,n}]$ |
| 4 | X | X | X | $i_{C,n} = \frac{2}{3} \cdot (i_{a,n} + \alpha \cdot i_{b,n} + \alpha^2 \cdot i_{c,n})$ |

Motor Nameplate Data

According to some aspects of the present disclosure, motor nameplate data is acquired and/or stored in memory 20. The motor nameplate data provides information used for induction motor inductance estimation. Such data can be extracted either directly from information provided by the manufacturer on the nameplate of a specific motor, or indirectly from other available sources, such as the manufacturer's website. Motor nameplates can include information like rated voltage(s), rated full-load amps for each voltage level frame size, rated frequency, number of phases, rated horsepower, rated speed, time rating, rated condition, National Electrical Manufacturers Association (NEMA) design letter, service factor, full-load efficiency, power factor, etc.

The rated condition refers to a state of motor operation explicitly defined by a specified stator voltage, stator current, and supply frequency. Information on the rated condition can be found on the motor nameplate. The rated voltage, $v_0$, which is typically measured in volts (V), is the root mean square (rms) stator voltage, necessary for motor operating at the rated condition. The rated current, $i_0$, which is typically measured in amperes (amps or A), is the rms stator current resulting from motor operation at the rated condition. The rated fundamental frequency, $f_0$, which is typically measured in hertz (Hz), is the supply frequency necessary for motor operation at the rated condition. The rated fundamental frequency is also known as the utility frequency in power generation, transmission, and distribution systems. It is the frequency at which alternating current is transmitted from power plants to end users. In the U.S., for example, the rated fundamental frequency is 60 Hz, while in many other parts of the world it is 50 Hz.

The rated speed, $r_0$, which is typically measured in revolutions per minute (RPM), is the rotor speed resulting from motor operation at the rated condition. The number of pole-pairs, P, is a design parameter. This quantity is generally not specified on the motor nameplate, but can be deduced from the rated speed $r_0$ and the rated fundamental frequency $f_0$ via:

$$P = \text{floor}(60 \cdot f_0 / r_0) \quad (1)$$

where floor($\cdot$) refers to the rounding of a real number to the nearest integer that is less than or equal to it.

The number of rotor slots, R, is another design parameter. For squirrel-cage induction motors, the number of rotor slots is equal to the number of longitudinal conductive bars, typically made of aluminum or copper, along the circumference of a cylinder-shaped rotor.

The rated slip, $s_0$, is the slip at rated condition. It can be computed from the rated fundamental frequency $f_0$, the rated speed $r_0$, and the number of pole-pairs P via:

$$s_0 = 1 - (P \cdot r_0)/(60 \cdot f_0) \quad (2)$$

The rated power factor, $PF_0$, is the power factor when the motor operates at the rated condition. In some cases, it is also marked as cos $\phi$ on the motor nameplate. The rated input power, $P_{IN,0}$, which is typically measured in watts (W), is the motor's input power when it operates at rated condition. It can be computed from the rated voltage $v_0$, the rated current $i_0$, and the rated power factor $PF_0$ via:

$$P_{IN,0} = \text{sqrt}(3) \cdot v_0 \cdot i_0 \cdot PF_0 \quad (3)$$

where sqrt($\cdot$) denotes the square root operation.

The rated output power, $P_{OUT,0}$, which can be measured in horsepower (hp), is the motor's output power at the rated condition. The rated efficiency, $\eta_0$, is the motor's efficiency when converting input power to output power at the rated condition. This quantity should be identical to the motor nameplate efficiency. If the motor nameplate efficiency is not available, then the rated efficiency $\eta_0$ is loosely associated with the rated voltage $v_0$, the rated current $i_0$, the rated power factor $PF_0$, and the rated output power $P_{OUT,0}$ via:

$$\eta_0 = (746 \cdot P_{OUT,0})/[\text{sqrt}(3) \cdot v_0 \cdot i_0 \cdot PF_0] \quad (4)$$

For example, the nameplate data for a 2-hp motor shows that the motor's rated voltage is $v_0 = 230$ V, rated current is $i_0 = 5.8$ A, rated fundamental frequency is $f_0 = 60$ Hz, and rated speed is $r_0 = 1165$ r/min. According to equation (1), above, the number of pole-pairs for this motor is P=3. The motor has 33 rotor slots, i.e., R=33. The motor's rated slip is $s_0 = 0.0292$ and rated power factor is $PF_0 = 0.74$, i.e., 74%. Consequently, the motor's rated input power is $P_{IN,0} = 1710$ W according to equation (3), above. The rated output power is $P_{OUT,0}=2$ hp, and the motor's rated efficiency is $\eta_0=0.865$, i.e., 86.5%.

Instantaneous Rotor Speed Detection

Figure 2:
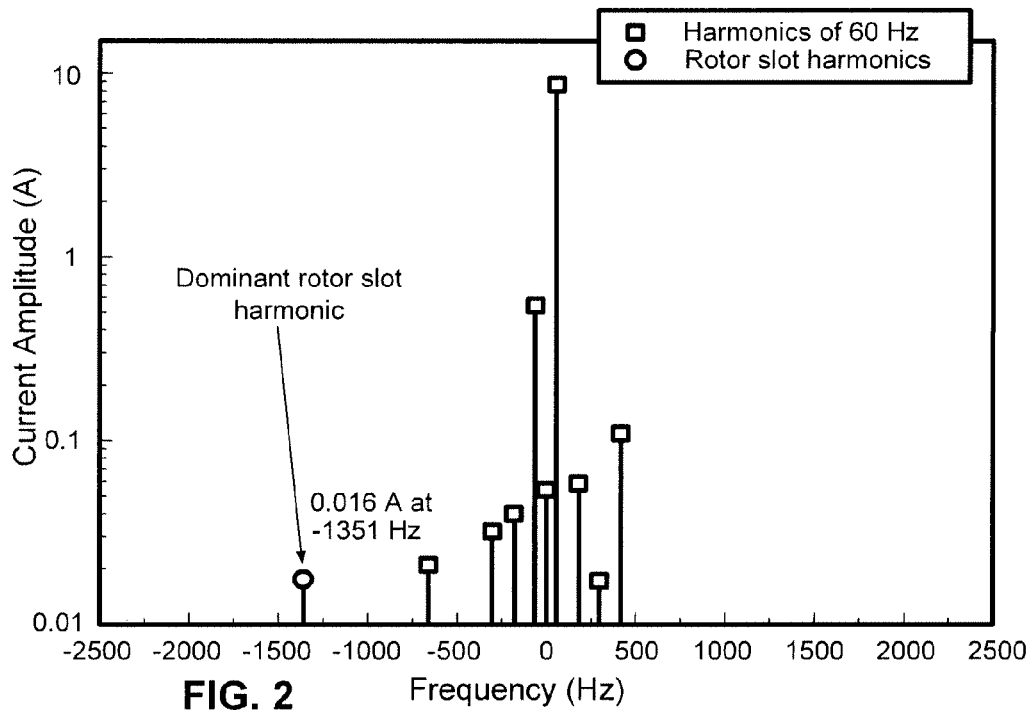
FIG. 2 is a graph showing the frequency spectrum of the complex current for a representative 2-hp induction motor with 33 rotor slots.

In some embodiments, an instantaneous rotor speed detector, indicated at 18 in FIG. 1, resolves an induction motor's instantaneous rotor speed, $\omega_{R,n}$, which can be measured in radians per second (rad/s), from speed-related high-frequency rotor slot harmonics found in the complex current $i_{C,n}$. By way of non-limiting example, FIG. 2 shows a frequency spectrum of the complex current for an exemplary 2-hp induction motor operated at around the rated condition. In this figure, a speed-related high-frequency rotor slot harmonic component appears at −1351 Hz. In this example, the instantaneous rotor speed detector 18 derives the induction motor's instantaneous rotor speed from this rotor slot harmonic frequency of −1351 Hz.

The instantaneous rotor speed detector is divided into three major subsystems: (1) fundamental frequency estimator; (2) rotor slot harmonic frequency detector; and (3) rotor speed estimator. A detailed discussion of a representative instantaneous rotor speed detector can be found in U.S. Pat. No. 7,769,552, to Roy S. Colby et al., which is entitled "Method and Apparatus for Estimating Induction Motor Rotor Temperature," and is incorporated herein by reference in its entirety.

The fundamental frequency estimator extracts an instantaneous fundamental frequency, $f_{0,n}$, which can be measured in hertz (Hz), from the complex voltage $v_{C,n}$. For most motors that are connected directly to regulated power distribution networks, this instantaneous fundamental frequency $f_{0,n}$ varies dynamically within a small range around the rated fundamental frequency $f_0$.

The rotor slot harmonic frequency detector extracts an instantaneous rotor slot harmonic frequency, $f_{sh,n}$ (in hertz), from the complex current $i_{C,n}$ using a structure that is similar to a superheterodyne receiver. For squirrel-cage induction motors, this instantaneous rotor slot harmonic frequency $f_{sh,n}$ is directly related to the rotor speed due to the fact that rotor slot harmonics are caused by the rotor slotting effects in squirrel-cage induction motors.

The rotor speed estimator calculates the instantaneous rotor speed $\omega_{R,n}$ from the instantaneous fundamental frequency $f_{0,n}$ and the instantaneous rotor slot harmonic frequency $f_{sh,n}$. If the rotor slot harmonic is the dominant rotor slot harmonic, i.e., the rotor slot harmonic has the largest amplitude among all rotor slot harmonics, as illustrated in FIG. 2, then the instantaneous rotor speed $\omega_{R,n}$ can be calculated by:

$$\omega_{R,n}=2\pi P\cdot(\pm f_{sh,n}-n_w\cdot f_{0,n})/(kR) \quad (5)$$

where $k=1,2,3,\ldots$, is the rotor magnetomotive force distribution harmonic order, and $n_w$ is the stator winding distribution harmonic order. The quantities $k$ and $n_w$, along with the '±' sign in equation (5), above, are all related to design parameters of specific squirrel-cage induction motors. For example, the aforementioned 2-hp motor has a rotor magnetomotive force distribution harmonic order $k=2$, a stator winding distribution harmonic order of $n_w=30$ 1, and the '−' sign is used in front of $f_{sh,n}$ in equation (5).

Induction Motor Inductance Estimation

Figure 3:
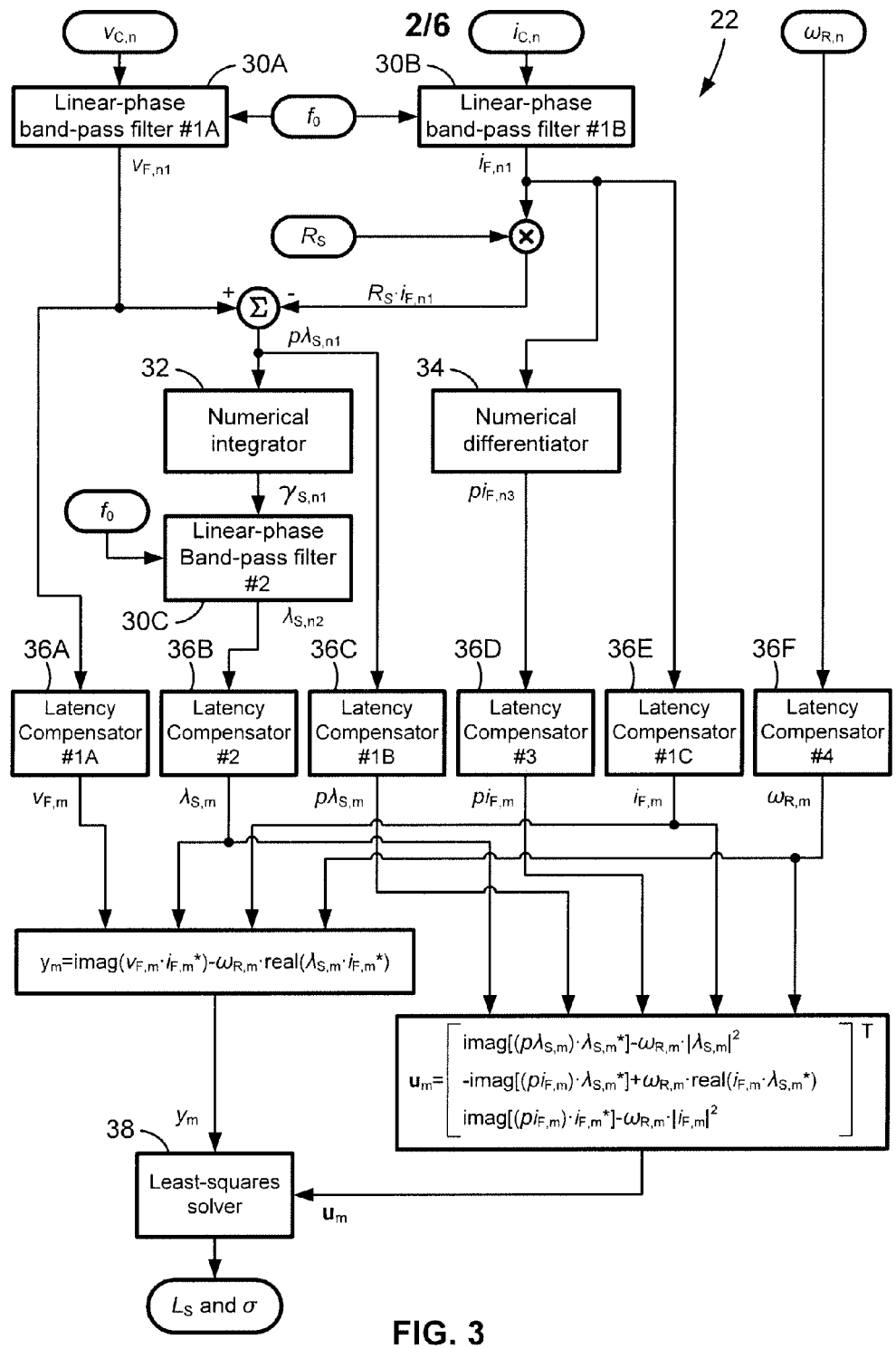
FIG. 3 is a schematic block diagram showing the structure of an exemplary induction motor inductance estimator.

The induction motor inductance estimator, indicated at 22 in FIG. 1, determines the stator inductance $L_S$, which is typically measured in henries (H), and the total leakage factor $\sigma$ for an induction motor from the complex voltage, the complex current, and the motor nameplate data. The architecture of an exemplary induction motor inductance estimator is schematically illustrated in FIG. 3. Formulated from the instantaneous reactive power theory and a dynamic induction motor equivalent circuit model, the induction motor inductance estimator 22 of FIG. 3 comprises three linear-phase band-pass filters 30A, 30B and 30C, a numerical integrator 32, a numerical differentiator 34, six latency compensators 36A-36F, and a least-squares solver 38. The instantaneous reactive power theory is described, for example, by: H. Akagi, Y. Kanazawa and A. Nabae, "Instantaneous Reactive Power Compensators Comprising Switching Devices Without Energy Storage Components," IEEE Transactions on Industry Applications, Vol. IA-20, No. 3, pp. 625-630, May/June 1984; J. L. Willems, "A New Interpretation of the Akagi-Nabae Power Components for Nonsinusoidal Three-phase Situations," IEEE Transactions on Instrumentation and Measurement, Vol. 41, No. 4, pp. 523-527, August 1992; and, F. Z. Peng and J.-S. Lai, "Generalized Instantaneous Reactive Power Theory for Three-phase Power Systems," IEEE Transactions on Instrumentation and Measurement, Vol. 45, No. 1, pp. 293-297, Feb. 1996, all of which are incorporated herein by reference in their respective entireties.

Linear-Phase Band-Pass Filters

Figure 4:
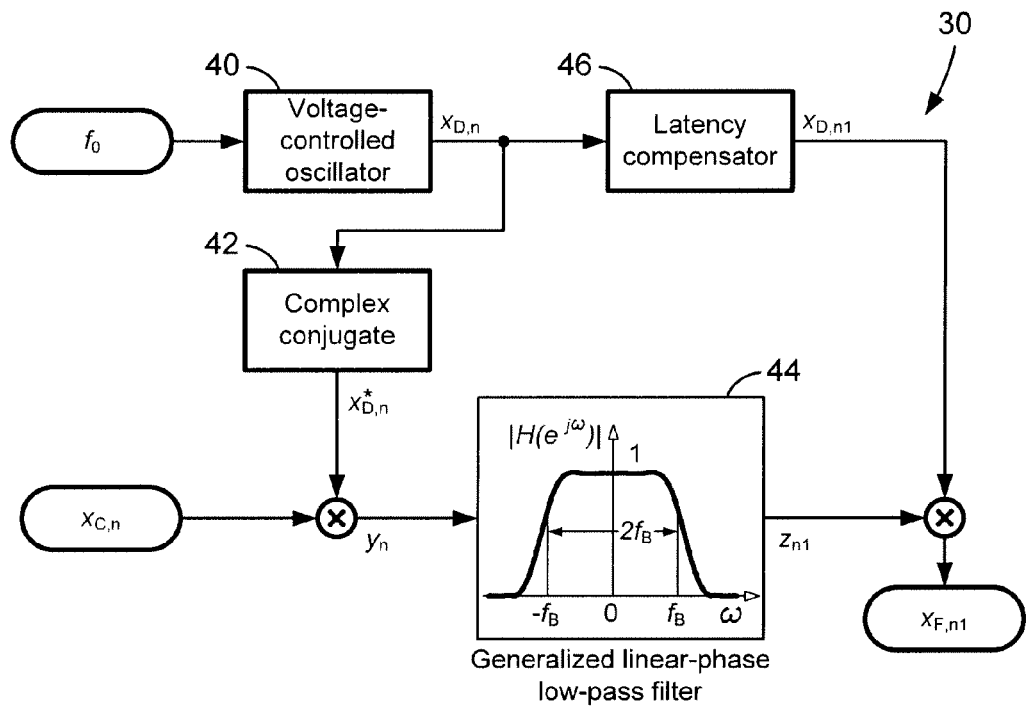
FIG. 4 is a schematic block diagram showing the structure of an exemplary linear-phase band-pass filter.

A linear-phase band-pass filter is typically used to preserve frequency components that are in the neighborhood of a predefined frequency in the complex voltage or the complex current, and to remove out-of-band interference and noise. FIG. 4, for example, shows the structure of an exemplary linear-phase band-pass filter subsystem, designated generally as 30. The linear-phase band-pass filter of FIG. 4 includes a voltage-controlled oscillator (VCO) 40, a complex conjugate 42, a generalized linear-phase low-pass filter 44, and a latency compensator 46.

Figure 5:
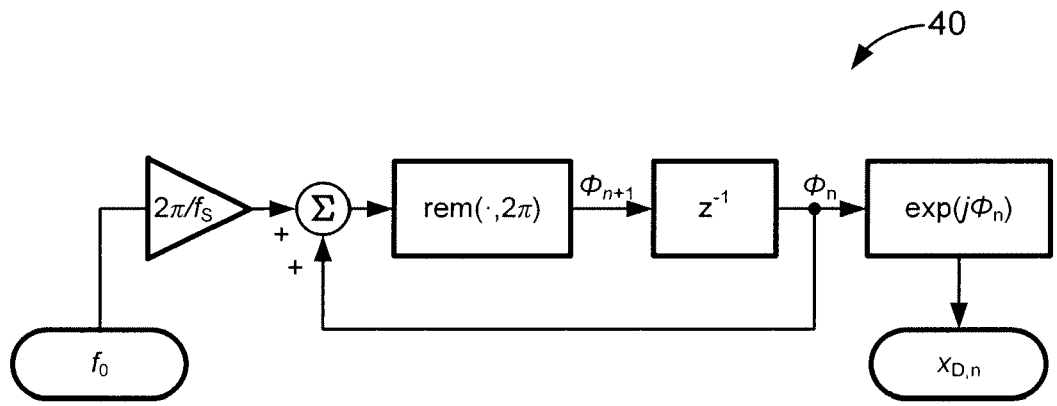
FIG. 5 is a schematic block diagram showing the structure of an exemplary voltage-controlled oscillator.

With continuing reference to FIG. 4, the VCO 40 is adapted to reduce the complexity of the filter architecture. In this embodiment, the VCO 40 takes the rated fundamental frequency $f_0$ as an input and synthesizes a complex exponential signal $x_{D,n}$ as an output at the nth sample, as seen in FIG. 5. The operation of VCO 40 of FIGS. 4 and 5 is characterized by the following two equations:

$$x_{D,n}=\exp(j\cdot\Phi_n) \quad (6)$$

$$\Phi_{n+1}=\text{rem}(\Phi_n+2\pi\cdot f_{X,n}/f_S, 2\pi) \quad (7)$$

where $\text{rem}(\Phi_n+2\pi\cdot f_{X,n}/f_S, 2\pi)$ denotes the remainder of $(\Phi_n+2\pi\cdot f_{X,n}/f_S)$ after it is divided by $2\pi$. This equation effectively wraps the phase $\Phi_{n+1}$ to a value between 0 and $2\pi$, and hence avoids arithmetic overflow.

The complex conjugate 42 of the VCO 40 output is denoted as $x_{D,n}^*$. By multiplying the linear-phase band-pass filter's input $x_{C,n}$ with the complex conjugate 42 of $x_{D,n}$, i.e., $$y_n=x_{C,n}\cdot x_{D,n}^* \quad (8)$$

a complex mixed signal $y_n$ is formed.

This complex mixed signal $y_n$ is subsequently fed into a generalized linear-phase low-pass filter, designated 44 in FIG. 4, of cutoff frequency $f_B$, which is typically measured in hertz (Hz). The generalized linear-phase low-pass filter 44 of FIG. 4 produces a complex baseband signal $z_{n1}$ as an output. By using this generalized linear-phase low-pass filter 44 to attenuate out-of-band interference or noise, signals between $-f_B$ and $f_B$ in $y_n$, including the signal at zero frequency, are retained, while signals beyond this $[-f_B\ f_B]$ range are suppressed.

Discrete-time finite impulse response (FIR) filters are often used to implement generalized linear-phase low-pass filters. Kaiser window design technique may be used to design such FIR filters. Carefully designed infinite impulse response (IIR) Bessel filters with approximately linear phase within $[-f_B\ f_B]$ may also be used. Compared with their FIR counterparts, the IIR filters usually offer similar performance with smaller computational burden.

Generally speaking, $f_B$ is smaller than $f_0$. In practice, the cutoff frequency $f_B$ is also chosen to accommodate periodic pulsations in the complex current. For example, if an induction motor has a load torque oscillation of approximately 12 Hz when driving a reciprocating compressor through belt-coupled flywheels, i.e., the motor's load torque oscillates around its average value 12 times per second, the cutoff frequency $f_B$ is set to a number greater than 12 Hz.

In addition, the generalized linear-phase low-pass filter 44 introduces a uniform time delay to all signals with frequencies between $-f_B$ and $f_B$. This uniform time delay guarantees that the phase information in the complex mixed signal $y_n$ is not distorted after passing through the generalized linear-phase low-pass filter. For an appropriately designed generalized linear-phase low-pass filter, the time delay introduced by the filter corresponds to the filter's group delay $n_L$ (in samples). For example, given a FIR filter with a filter order of N (N is even), the filter's group delay is $n_L=N/2$.

Figure 6A:
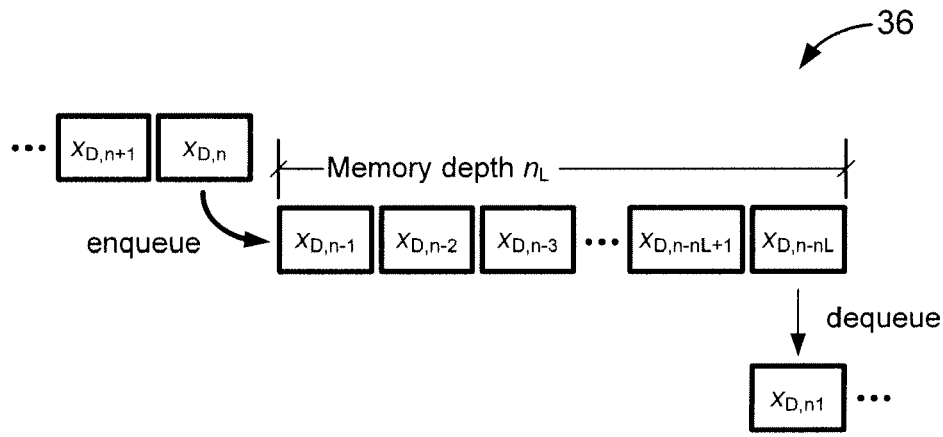
FIG. 6A is a schematic block diagram showing the structure of an exemplary latency compensator at the nth sample.
Figure 6B:
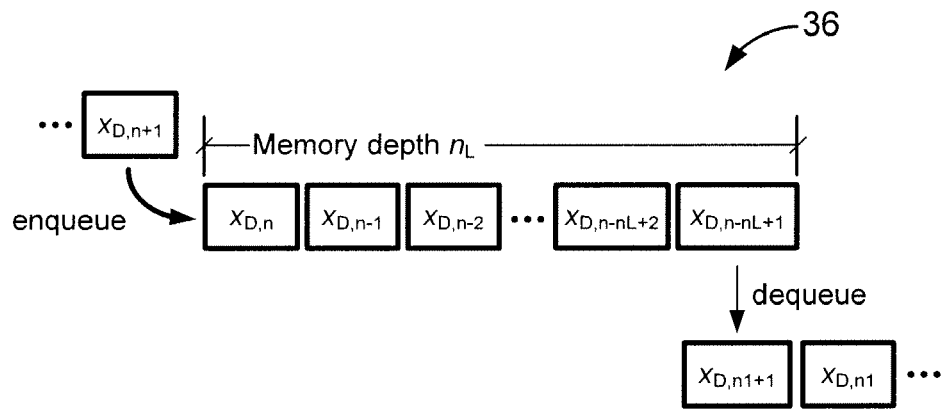
FIG. 6B is a schematic block diagram showing the structure of an exemplary latency compensator at the (n+1)th sample.

A latency compensator 46 is introduced into the linear-phase band-pass filter 30 of FIG. 4 to compensate for the group delay $n_L$ and to synchronize the complex exponential signal $x_{D,n}$ and the complex baseband signal $z_{n1}$ to the same epoch. For example, as shown in FIGS. 6A and 6B, a latency compensator is typically a first-in first-out queue with a memory depth of $n_L$ samples ($n_L$ is a nonnegative integer). Denoted by a delay(·) operator in equation (9), below, the latency compensator 46 output at the nth sample $x_{D,n1}$ is the $(n-n_L)$th sample of $x_{D,n}$:

$$x_{D,n1}=\text{delay}(x_{D,n},n_L)=x_{D,n}z^{-nL}=x_{D,n-nL} \quad (9)$$

where $z^{-nL}$ denotes a delay of $n_L$ samples.

Usually, the generalized linear-phase low-pass filter 44 has a start-up transient caused by a zero initial condition in the filter's internal states. This issue is addressed by discarding the filter's output that corresponds to the start-up transient.

The linear-phase band-pass filter 30 output $x_{F,n1}$ is produced by multiplying the complex baseband signal $z_{n1}$ with the latency compensator output $x_{D,n1}$:

$$x_{F,n1}=x_{D,n1} \cdot z_{n1} \quad (10)$$

In FIG. 3, the linear-phase band-pass filters 30A, 30B and 30C can all have the same structure as the linear-phase band-pass filter 30 of FIG. 4 described above. In one preferred embodiment, the generalized linear-phase low-pass filter 44 in the first linear-phase band-pass filter 30A is a FIR filter with a filter order of $N_1$ ($N_1$ is even). In this embodiment, the generalized linear-phase low-pass filter 44 used in the second linear-phase band-pass filter 30B is a similar FIR filter with a filter order that is also $N_1$. The linear-phase band-pass filters 30A, 30B are used to filter the complex voltage $v_{C,n}$ and the complex current $i_{C,n}$, respectively. A complex fundamental voltage, $v_{F,n1}$, which is typically measured in volts (V) is produced as the output by the linear-phase band-pass filter 30A Similarly, a complex fundamental current, $i_{F,n1}$, which is typically measured in amperes (amps or A), is produced as the output by the linear-phase band-pass filter 30B. While these two generalized linear-phase low-pass filters have the same filter order, it is worth noting that they do not need to have the same filter coefficients.

The third linear-phase band-pass filter 30C in FIG. 3 is used to suppress the influence from an unknown initial condition when calculating a complex stator flux linkage, $\lambda_{S,n2}$, which is typically measured in volts·s (V·s). Consequently, the generalized linear-phase low-pass filter 44 of the third linear-phase band-pass filter 30C may have a different filter order, denoted as $N_2$ ($N_2$ is even), and a set of different filter coefficients as compared to its two counterparts used in the first and second linear-phase band-pass filters 30A, 30B. In addition, to preserve information in the complex stator flux linkage $\lambda_{S,n2}$, the linear-phase band-pass filter 30C should have a uniform amplitude response and a constant ground delay in the neighborhood of the rated fundamental frequency $f_0$.

In the illustrated embodiment, the latency compensators 46 used in both the first and second linear-phase band-pass filters 30A and 30B have a memory depth of $N_1/2$. The latency compensator 46 used in the third linear-phase band-pass filter 30C has a memory depth of $N_2/2$.

Numerical Integrator

Figure 7:
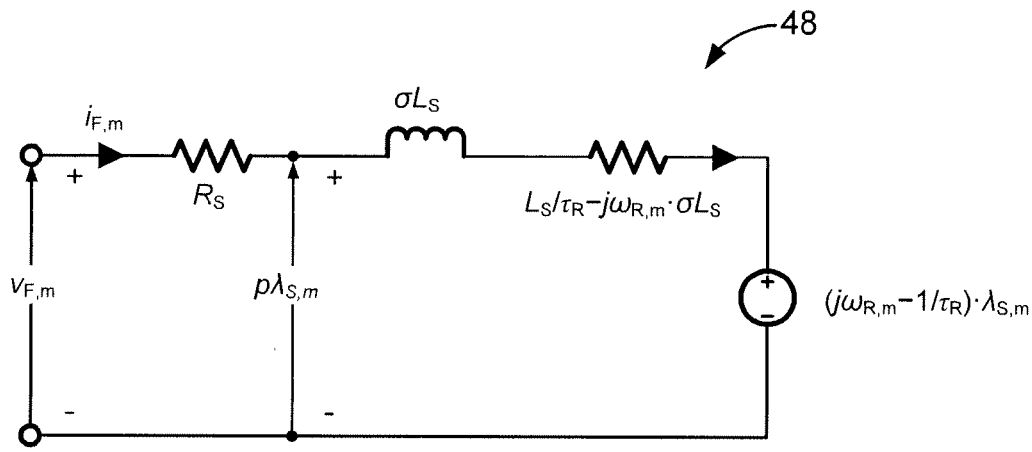
FIG. 7 is a circuit diagram showing an exemplary dynamic equivalent circuit model that characterizes the induction motor's stator and rotor circuit equations in a stationary reference frame.

FIG. 7 is a circuit diagram showing an exemplary induction motor equivalent circuit model, designated generally as 48, in a stationary reference frame. In this figure, $R_S$, which is typically measured in ohms ($\Omega$), is the stator resistance, and $\tau_R$, which is typically measured in seconds (s), is the rotor time constant. The subscript m denotes a temporal index. This subscript may be replaced by notations such as n1 or n3 to denote other temporal indices. According to FIG. 7, a continuous-time derivative of the complex stator flux linkage, $p\lambda_{S,n1}$, is computed from the complex fundamental voltage $v_{F,n1}$ and the complex fundamental current $i_{F,n1}$ via:

$$p\lambda_{S,n1}=v_{F,n1}-R_S \cdot i_{F,n1} \quad (11)$$

where p denotes a continuous-time derivative operator d/dt.

The actual stator resistance should be used if it is available from either measurement or motor manufacturer. If the actual stator resistance is not available, some embodiments of the present disclosure compute a static estimate of the stator resistance based on the motor nameplate data:

$$R_S=1.155\times10^{-2}\times v_0/i_0 \quad (12)$$

The static estimate of the stator resistance from equation (12), above, may be adjusted accordingly to reflect temperature-dependent resistance variations.

To obtain the complex stator flux linkage $\lambda_{S,n2}$, a numerical integrator is disclosed herein. The numerical integrator takes the continuous-time derivative of the complex stator flux linkage, $p\lambda_{S,n1}$, as an input, and produces an output, $\gamma_{S,n1}$, typically in volts·s (V·s), which corresponds to a complex stator flux linkage with a zero initial condition.

Figure 8:
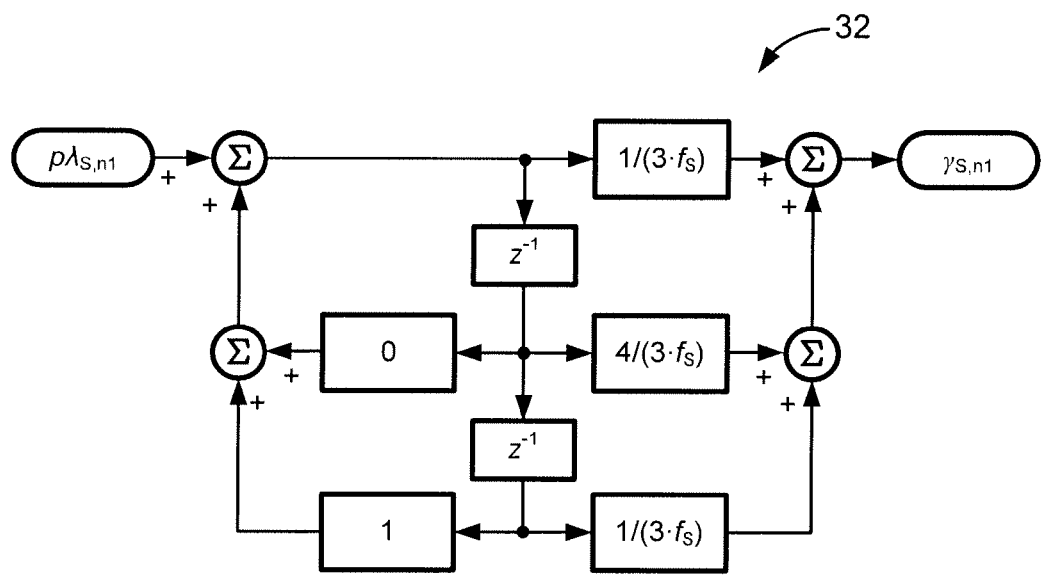
FIG. 8 is a schematic block diagram showing the structure of an exemplary numerical integrator based on the Simpson's rule for numerical integration.

FIG. 8 is a schematic block diagram illustrating the structure of a representative numerical integrator, designated generally as 32, based on the Simpson's rule for numerical integration. The structure is a direct form II implementation for discrete-time systems. See A. V. Oppenheim, R. W. Schafer, and J. R. Buck, "Discrete-Time Signal Processing," 2nd ed. Upper Saddle River, N.J.: Prentice-Hall, 1999, pp. 347-348, which is incorporated herein by reference in its entirety. The corresponding difference equation describing the relationship between the numerical integrator's input $p\lambda_{S,n1}$ and output $\gamma_{S,n1}$ is:

$$\gamma_{S,n1}=z^{-2} \cdot \gamma_{S,n1}+[1/(3 \cdot f_S)+4(3 \cdot f_S) \cdot z^{-1}+1/(3 \cdot f_S) \cdot z^{-2}] \cdot p\lambda_{S,n1} \quad (13)$$

where $z^{-1}$ and $z^{-2}$ denote one- and two-sample delays, respectively.

In the illustrated embodiment, the output produced by the numerical integrator 32 corresponds to a complex stator flux linkage with a zero initial condition. However, the true complex stator flux linkage may not have a zero initial condition. Therefore, the third linear-phase band-pass filter 30C can be used to reconcile this discrepancy in initial conditions and to obtain the complex stator flux linkage $\lambda_{S,n2}$. As noted above, the third linear-phase band-pass filter 30C can have the same structure as the first or the second linear-phase band-pass filters 30A, 30B. However, the generalized linear-phase low-pass filter 44 used in the linear-phase band-pass filter 30C may have a different cutoff frequency $f_B$. This cutoff frequency $f_B$ should be smaller than the rated fundamental frequency $f_0$ to ensure that dc components in $\gamma_{S,n1}$ are attenuated after filtering. If the induction motor is used to drive periodically time-varying loads, such as reciprocating compressors, the cutoff frequency $f_B$ should also be greater than the load's inherent periodic pulsation frequency. As a result of this different cutoff frequency $f_B$, the filter order and the filter coefficients may also be different, and consequently the latency compensator used in the third linear-phase band-pass filter 30C may have a different memory depth.

Numerical Differentiator

Figure 9:
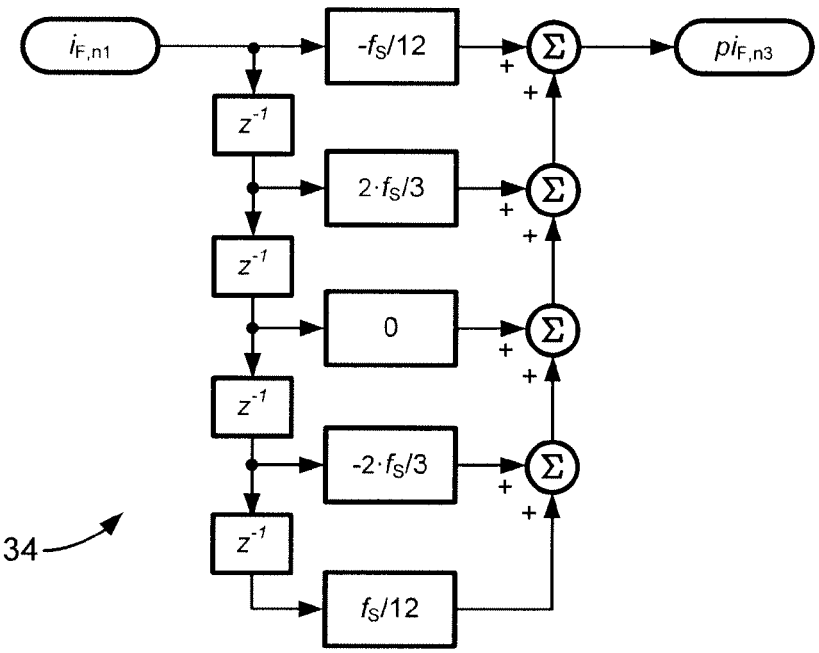
FIG. 9 is a schematic block diagram showing the structure of an exemplary numerical differentiator based on the five-point formula for numerical differentiation.

In the induction motor inductance estimator 22 of FIG. 3, a numerical differentiator 34 is used to compute an approximate of a continuous-time derivative of the complex fundamental current $pi_{F,n1}$. A five-point formula:

$$pi_{F,n3} = [-f_S/12 + (2 \cdot f_S/3) \cdot z^{-1} - (2 \cdot f_S/3) \cdot z^{-3} + (f_S/12) \cdot z^{-4}] \cdot i_{F,n1} \qquad (14)$$

is used for this purpose. According to equation (14), above, the approximation error in $pi_{F,n3}$ is proportional to $1/f_S^4$. FIG. 9 is a schematic block diagram showing the structure of an exemplary numerical differentiator 34 based on the five-point formula for numerical differentiation.

In one preferred embodiment, the five-point formula (14) is utilized because of its simplicity and superior accuracy. However, other potential methods that may be used as a substitute for the five-point formula (14) to compute $pi_{F,n3}$ include, for example, the forward- or back-ward difference formula, three-point formulas, and Kaiser window-based discrete-time differentiators.

A new subscript "n3" is introduced in (14) because a time delay is produced by the numerical differentiator. For the five-point formula used in (14), this time delay is 2 samples. As illustrated in FIG. 3, the time delay is compensated by a latency compensator 36D to ensure temporal alignment among all signals before the recursive least-squares solver is executed.

Latency Compensator

For an independent signal, like the complex voltage $v_{C,n}$ or the complex current $i_{C,n}$, a causal signal processing method usually incurs an associated time delay along the processing path between its input and output. Before computing a new signal from two or more independent signals, the time delay of each independent signal must be reconciled such that the effective time delay after reconciliation is identical, i.e., the independent signals are temporally synchronized.

The latency compensator 36, with its structure elaborated in FIGS. 6A and 6B, ensures a precise temporal synchronization by compensating for the time delays that various subsystems introduce along their processing paths in the induction motor inductance estimator 22. As described above with respect to the linear-phase band-pass filter subsystem 30 of FIG. 4, the latency compensator 36 is a first-in first-out queue with a predetermined memory depth of $n_L$ samples. In some embodiments of the present disclosure, the latency compensator 36 takes the form of a circular buffer. Implementation of the latency compensator 36 may also take forms other than a circular buffer.

The design of each of the individual latency compensators 36A-36F in FIG. 3 can be accomplished by evaluating an aggregate time delay associated with various processing paths, identifying the path with the largest time delay, and defining appropriate additional time delays required for each of the remaining signals so that the time delays after reconciliation are identical. Continuing with the previous example, wherein both the first and second linear-phase band-pass filters 30A, 30B contain FIR filters with a filter order $N_1$ ($N_1$ is even), and the third linear-phase band-pass filter 30C contains a FIR filter with a filter order $N_2$ ($N_2$ is even), and mandating that $N_2 \geq 4$, Table IV provides design rules for the latency compensators used in FIG. 3.

TABLE III

Latency Compensator Memory Depth

| Case | Memory Depth $n_L$ (in samples) |
| --- | --- |
| Latency compensator #1A | $N_2/2$ |
| Latency compensator #1B | $N_2/2$ |
| Latency compensator #1C | $N_2/2$ |
| Latency compensator #2 | 0 |
| Latency compensator #3 | $(N_2/2) - 2$ |
| Latency compensator #4 | $(N_1 + N_2)/2$ |

A latency compensator with a zero memory depth, such as the "latency compensator #2" in Table III, is effectively a block that passes an input directly to the output, i.e., $$\lambda_{S,m} = \lambda_{S,n2} \qquad (15)$$

In FIG. 3, the subscript m denotes that all quantities have been temporally synchronized after all latency compensators have been executed. Moreover, in induction motor inductance estimator, latency compensators with a zero memory depth, such as the "latency compensator #2" in Table III, are typically reserved to accommodate potential modifications in software or hardware implementations. For example, if additional time delays are desired before calculating a least-squares solution, the new structure may be conveniently implemented by updating the memory depth of those reserved latency compensators.

Least-Squares Solver

The induction motor inductance parameters are related to the motor's instantaneous reactive power. In particular, the instantaneous reactive power of a three-phase symmetrical induction motor with a floating neutral point can be defined and related to the motor's inductance parameters. A least-squares solver, one of which is illustrated at 38 in FIG. 3, can be used to estimate the induction motor inductance parameters in an efficient and robust manner based on the motor's instantaneous reactive power.

To start with, given $v_{F,m}$, $\lambda_{S,m}$, $p\lambda_{S,m}$, $pi_{F,m}$, $i_{F,m}$, and $\omega_{R,m}$ from the outputs of the first, second, third, fourth, fifth and sixth latency compensators 36A-36F, respectively, the induction motor's instantaneous reactive power $q_{F,m}$ (in VAr) can be defined as:

$$q_{F,m} = 3/2 \cdot \text{imag}(v_{F,m} \cdot i_{F,m}^*) \qquad (16)$$

where $\text{imag}(\cdot)$ denotes the imaginary part of a complex quantity, and the superscript * denotes the conjugate of a complex quantity. The constant coefficient 3/2 is included in equation (16) so that the instantaneous reactive power $q_{F,m}$ corresponds to a 3-phase quantity.

According to FIG. 7, $$v_{F,m} = R_S \cdot i_{F,m} + p\lambda_{S,m} \qquad (17)$$

$$p\lambda_{S,m} = \sigma L_S \cdot (pi_{F,m}) + (L_S/\tau_R - j\omega_{R,m} \cdot \sigma L_S) \cdot i_{F,m} + (j\omega_{R,m} - 1/\tau_R) \cdot \lambda_{S,m} \qquad (18)$$

Substituting equation (17) into the right side of equation (16) yields:

$$\text{imag}(v_{F,m} \cdot i_{F,m}^*) = \text{imag}(R_S \cdot |i_{F,m}|^2) + \text{imag}[(p\lambda_{S,m}) \cdot i_{F,m}^*] \quad (19)$$

where $|\cdot|$ denotes the modulus of a complex quantity. The first term on the right side of equation (19) is zero because the expression $R_S \cdot |i_{F,m}|^2$ is real, and hence not related to the instantaneous reactive power $q_{F,m}$. Expanding the second term on the right side of equation (19) according to equation (18) yields:

$$\text{imag}(v_{F,m} \cdot i_{F,m}^*) = \text{imag}[\sigma L_S \cdot (p i_{F,m}) \cdot i_{F,m}^* + (L_S/\tau_R) \cdot |i_{F,m}|^2 - j\omega_{R,m} \cdot \sigma L_S \cdot |i_{F,m}|^2 + j\omega_{R,m} \cdot \lambda_{S,m} \cdot i_{F,m}^* - (1/\tau_R) \cdot \lambda_{S,m} \cdot i_{F,m}^*] \quad (20)$$

In equation (20), $\text{imag}[(L_S/\tau_R) \cdot |i_{F,m}|^2] = 0$ because the expression $(L_S/\tau_R) \cdot |i_{F,m}|^2$ is real, and hence not related to the instantaneous reactive power $q_{F,m}$. In addition, $\text{imag}(j\omega_{R,m} \cdot \sigma L_S \cdot |i_{F,m}|^2) = \omega_{R,m} \cdot \sigma L_S \cdot |i_{F,m}|^2$, and $\text{imag}(j\omega_{R,m} \cdot \lambda_{S,m} \cdot i_{F,m}^*) = \omega_{R,m} \cdot \text{real}(\lambda_{S,m} \cdot i_{F,m}^*)$, where $\text{real}(\cdot)$ denotes the real part of a complex quantity. Furthermore, $\text{imag}[-(1/\tau_R) \cdot \lambda_{S,m} \cdot i_{F,m}^*] = \text{imag}[(1/\tau_R) \cdot \lambda_{S,m}^* \cdot i_{F,m}]$. As a result, equation (20) can be simplified to:

$$\text{imag}(v_{F,m} \cdot i_{F,m}^*) = \sigma L_S \cdot \{\text{imag}[(p i_{F,m}) \cdot i_{F,m}^*] - \omega_{R,m} \cdot |i_{F,m}|^2\} + \omega_{R,m} \cdot \text{real}(\lambda_{S,m} \cdot i_{F,m}^*) + \text{imag}[(1/\tau_R) \cdot \lambda_{S,m}^* \cdot i_{F,m}] \quad (21)$$

According to equation (18):

$$(L_S/\tau_R) \cdot i_{F,m} = p\lambda_{S,m} - \sigma L_S \cdot (p i_{F,m}) + j\omega_{R,m} \cdot \sigma L_S \cdot i_{F,m} - (j\omega_{R,m} - 1/\tau_R) \cdot \lambda_{S,m} \quad (22)$$

Substituting equation (22) into the last term on the right side of equation (21), and noting that $\text{imag}[(1/\tau_R) \cdot |\lambda_{S,m}|^2] = 0$, the following equation is obtained:

$$\text{imag}(v_{F,m} \cdot i_{F,m}^*) - \omega_{R,m} \cdot \text{real}(\lambda_{S,m} \cdot i_{F,m}^*) = \quad (23)$$
$$(1/L_S) \cdot \{\text{imag}[(p\lambda_{S,m}) \cdot \lambda_{S,m}^*] - \omega_{R,m} \cdot |\lambda_{S,m}|^2\} +$$
$$\sigma \cdot \{-\text{imag}[(p i_{F,m}) \cdot \lambda_{S,m}^*] + \omega_{R,m} \cdot \text{real}(i_{F,m} \cdot \lambda_{S,m}^*)\} +$$
$$\sigma L_S \cdot \{\text{imag}[(p i_{F,m}) \cdot i_{F,m}^*] - \omega_{R,m} \cdot |i_{F,m}|^2\}$$

To obtain an accurate estimate of induction motor inductance parameters, first compute a scalar $y_m$ that corresponds to the left side of equation (23):

$$y_m = \text{imag}(v_{F,m} \cdot i_{F,m}^*) - \omega_{R,m} \cdot \text{real}(\lambda_{S,m} \cdot i_{F,m}^*) \quad (24)$$

Then compute the elements in a 1×3 row vector $u_m = [u_{m,1}, u_{m,2}, u_{m,3}]$ $$u_{m,1} = \text{imag}[(p\lambda_{S,m}) \cdot \lambda_{S,m}^*] - \omega_{R,m} \cdot |\lambda_{S,m}|^2 \quad (25)$$

$$u_{m,2} = -\text{imag}[(p i_{F,m}) \cdot \lambda_{S,m}^*] + \omega_{R,m} \cdot \text{real}(i_{F,m} \cdot \lambda_{S,m}^*) \quad (26)$$

$$u_{m,3} = \text{imag}[(p i_{F,m}) \cdot i_{F,m}^*] - \omega_{R,m} \cdot |i_{F,m}|^2 \quad (27)$$

If a 3×1 solution vector $\xi_m$ is defined as a function of the induction motor inductance parameters, then:

$$\xi_m = [\xi_{m,1}, \xi_{m,2}, \xi_{m,3}]^T = [1/L_S, \sigma, \sigma L_S]^T \quad (28)$$

where the superscript T denotes a matrix transpose, then the following equation establishes a relationship between $u_m$, $\xi_m$, and $y_m$ according to equation (23):

$$u_m \cdot \xi_m = y_m \quad (29)$$

Figure 10:
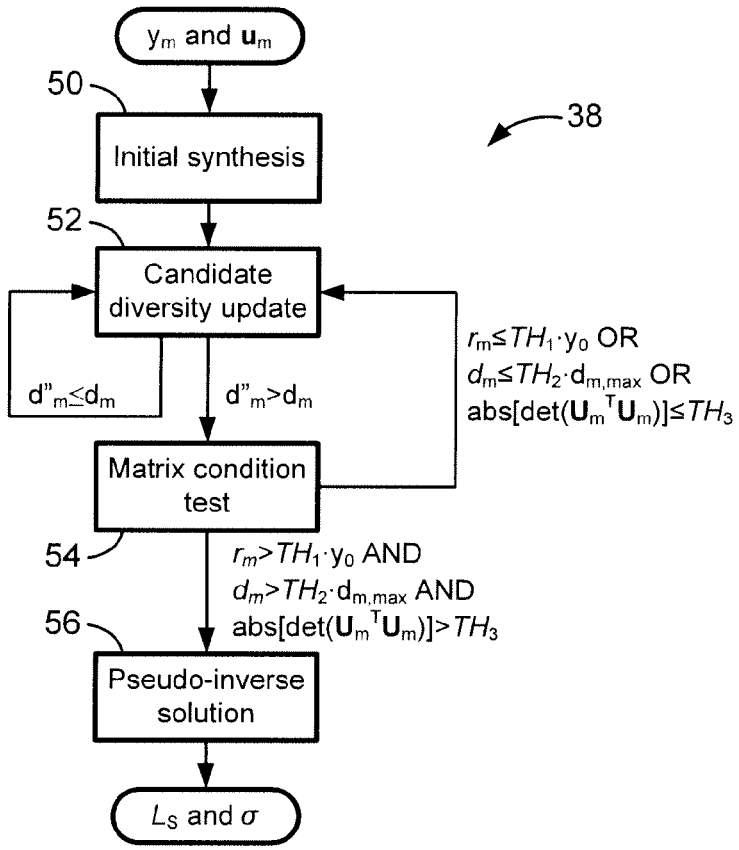
FIG. 10 is a schematic block diagram showing the structure of an exemplary least-squares solver.

The least-squares solver 38 applies a pseudo-inverse solution to a well-conditioned source matrix $U_m$ along with a well-conditioned source vector $Y_m$, both with elements constructed according to equations (24)-(27). Elements in the well-conditioned source vector $Y_m$ are closely related to the induction motor's instantaneous reactive power $q_{F,m}$. Because all of the elements in equation (29) are real quantities, the least-squares solver 38 can operate efficiently and obtain accurate results. FIG. 10 is a schematic block diagram showing the structure of an exemplary least-squares solver 38, which includes four major subsystems: (1) initial synthesis 50; (2) candidate diversity update 52; (3) matrix condition test 54; and (4) pseudo-inverse solution 56.

Initial Synthesis

The initial synthesis process 50 constructs a sorted source matrix $U_m$ and a sorted source vector $Y_m$. The initial synthesis process 50 is generally only executed once, and the control flow is then transitioned to the subsequent candidate diversity update process 52.

First, the initial synthesis process 50 constructs an initial source matrix $U_0$ by computing $N_D$ samples of $u_m$ according to equations (25)-(27). The initial source vector $Y_0$ is formed by computing $N_D$ samples of $y_m$:

$$U_0 = [u_{m-N_D+1}^T \; u_{m-N_D+2}^T \ldots u_{m-1}^T \; u_m^T]^T \quad (30)$$

$$Y_0 = [y_{m-N_D+1} \; y_{m-N_D+2} \ldots y_{m-1} \; y_m]^T \quad (31)$$

where the superscript T denotes a matrix transpose. In equations (30)-(31), above, the initial source matrix $U_0$ is a $N_D \times 3$ matrix, and the initial source vector $Y_0$ is a $N_D \times 1$ column vector.

It is desirable that each element in $Y_0$ match the corresponding row in $U_0$. In addition, each element in $Y_0$ is a real positive number. The initial synthesis process 50 rearranges these real positive elements in $Y_0$ and produces a sorted source vector $Y_m$, whose elements increase in magnitude. The initial synthesis process also rearranges rows in $U_0$ and produces a sorted source matrix $U_m$, whose rows correspond to the elements in $Y_m$.

$$U_m = [u_1^T \; u_2^T \ldots u_{N_N-1}^T \; u_{N_D}^T]^T \quad (32)$$

$$Y_m = [y_1 \; y_2 \ldots y_{N_D-1} \; y_{N_D}]^T \quad (33)$$

From now on, the subscripts, such as those used in equations (32)-(33), above, no longer represent temporal indices. They are used to enumerate rows in $U_m$ and $Y_m$.

Based on the dimension of the solution vector $\xi_m$, $N_D$ must be greater than or equal to 3 to support the least-squares solution. The choice of $N_D$ also determines the computational complexity as well as the accuracy of the final estimates of induction motor inductance parameters. The larger the $N_D$ is, the more computational complex the least-squares solver becomes. In the meantime, the final estimate of induction motor inductance parameters may become more accurate.

Candidate Diversity Update

Linearly dependent rows may exist in the sorted source matrix $U_m$. Their existence leads to a singular $U_m^T U_m$, and hence yields no useful induction motor inductance parameters when the pseudo-inverse solution is directly applied. Therefore, linear independence in the sorted source matrix $U_m$ is a prerequisite for the pseudo-inverse solution. In addition, the rows in the sorted source matrix $U_m$ need to cover a broad range of motor operation conditions. To serve this purpose, a source diversity is defined as a product of differences between adjacent elements in the sorted source vector $Y_m$:

$$d_m = \prod_{i=1}^{N_D-1} (y_{i+1} - y_i) \quad (34)$$

This source diversity reflects the linear independence as well as the aggregate spread of motor operation conditions among the rows of the sorted source matrix $U_m$.

The candidate diversity update process 52 seeks opportunities to improve the source diversity $d_m$ in a computationally efficient manner. A maximized source diversity $d_m$ is associated with a sorted source matrix $U_m$ that has optimal linear independence and maximum aggregate spread of motor operation conditions among its rows. This process ensures a meaningful pseudo-inverse solution.

The candidate diversity update process 52 starts each time a set of new candidates, denoted as $y'_m$ and $u'_m$, is available. The process constructs an augmented source vector $Y'_m$ by including $y'_m$ and all elements from $Y_m$ in an ascending order, e.g., $$Y'_m = [y_1 \, y_2 \ldots y_i \, y'_m \, y_{i+1} \ldots y_{N_D-1} \, y_{N_D}]^T \quad (35)$$

where $y_1 \leq y_2 \leq \ldots \leq y_i \leq y'_m \leq y_{i+1} \leq \ldots \leq y_{N_D-1} \leq y_{N_D}$.

The candidate diversity update process 52 iteratively removes from $Y'_m$ an individual element that originally belongs to $Y_m$, and evaluates the source diversity of a remnant vector $Y''_m$. For example, if $y_i$ is removed from $Y'_m$, the source diversity of the remnant vector $Y''_m$ is:

$$d''_m = (y_2-y_1)(y_3-y_2) \ldots (y'_m-y_{i-1})(y_{i+1}-y'_m) \ldots (y_{N_D}-y_{N_D-1}) \quad (36)$$

Each removal results in one remnant vector and one associated source diversity. Since a total of $N_D$ remnant vectors are obtained from $Y'_m$, the candidate diversity update process computes $N_D$ source diversities $d''_m$. If the maximum value of these $N_D$ source diversities is greater than the source diversity of the existing sorted source vector $Y_m$, the candidate diversity update process creates a modified source vector by replacing the existing sorted source vector $Y_m$ with the remnant vector $Y''_m$ that has the maximum source diversity. In case there are multiple remnant vectors that have the maximum source diversity, the candidate diversity update process randomly selects one such remnant vector to replace the existing sorted source vector $Y_m$.

When the existing sorted source vector $Y_m$ is replaced by a remnant vector $Y''_m$, a modified source matrix is created in the meantime by replacing the existing sorted source matrix $U_m$ with a corresponding remnant matrix $U''_m$. For example, if the source vector $Y_m$ is substituted by the remnant vector $Y''_m$ in the form of:

$$Y''_m = [y_1 \, y_2 \ldots y_{i-1} \, y'_m \, y_{i+1} \ldots y_{N_D-1} \, y_{N_D}]^T \quad (37)$$

then the source matrix $U_m$ is replaced at the same time by a corresponding remnant matrix $U''_m$ in the form of:

$$U''_m = [u_1^T \, u_2^T \ldots u_{i-1}^T \, u'^T_m \, u_{i+1}^T \ldots u_{N_D-1}^T \, u_{N_D}^T]^T. \quad (38)$$

In real-time implementation, the candidate diversity update process 52 may be optimized by constructing augmented source vector $Y'_m$ only when $y'_m$ is different from any element in $Y_m$. Furthermore, assuming that the distance between $y_i$ and $y_{i+1}$ is the smallest among all adjacent elements in $Y_m$, if $y'_m$ falls between $y_i$ and $y_{i+1}$, then the candidate diversity update process 52 retains the original source vector $Y_m$, skips the rest of the calculations, and waits for the next set of new candidates. This is because $y'_m$ brings no improvement on the source diversity.

The candidate diversity update process 52 may accept new candidates $y'_m$ and $u'_m$ and execute at an interval that is significantly larger than a sampling interval $T_S$, typically measured in seconds(s), which is defined as $T_S=1/f_S$. This practice reduces the computational burden on hardware because line-connected induction motors generally do not have drastic changes in their operation conditions in each sampling interval.

If the source diversity remains unchanged after executing the above algorithm, i.e., all $d''_m$ are less than or equal to $d_m$, the candidate diversity update process 52 transitions to itself, i.e., waits for the next set of new candidates $y'_m$ and $u'_m$. If the source diversity attains improvement, i.e., there is at least one $d''_m$ that is greater than $d_m$, the candidate diversity update process 52 transitions to the matrix condition test process 54.

Matrix Condition Test

The matrix condition test process 54 evaluates the condition of a matrix $U_m^T U_m$ through a computationally efficient indirect method. Instead of computing the condition number directly through singular value decomposition, a dedicated and computationally intensive numerical process, the matrix condition test process evaluates the condition of the matrix $U_m^T U_m$ by examining (1) a source range $r_m$, (2) the source diversity $d_m$, and (3) the determinant of $U_m^T U_m$. The matrix condition test ensures that the condition of the matrix $U_m^T U_m$ is sufficiently large when the matrix $U_m^T U_m$ is inverted in the pseudo-inverse solution process.

The matrix condition test process 54 tests whether the rows of the modified source matrix $Y_m$ cover a certain range of induction motor operating conditions. To serve this purpose, the source range is defined from the modified source vector $Y_m$ as:

$$r_m = \max(Y_m) - \min(Y_m) = y_{N_D} - y_1 \quad (39)$$

At the rated condition, the value of $y_m$ is approximated by:

$$y_0 = 2 \cdot s_0 \cdot v_0 \cdot i_0 \cdot \mathrm{sqrt}(1-PF_0^2)/\mathrm{sqrt}(3) \quad (40)$$

Given a $N_D \times 1$ modified source vector $Y_m$ with a source range $r_m$, the maximum possible source diversity is $$d_{m,max} = [r_m/(N_D-1)]^{(N_D-1)} \quad (41)$$

The matrix condition test process 54 examines the source range $r_m$ and the source diversity $d_m$ of the modified source vector $Y_m$ from the candidate diversity update process 52. If either the source range $r_m$ is less than or equal to a predetermined fraction of $y_0$, i.e., $r_m \leq TH_1 \cdot y_0$, $0<TH_1 \leq 1$, or the source diversity $d_m$ is less than or equal to a predetermined threshold of $d_{m,max}$, i.e., $d_m \leq TH_2 \cdot d_{m,max}$, $0<TH_2 \leq 1$, then the matrix condition process regards the modified source matrix $U_m$ and the modified source vector $Y_m$ as being insufficiently diverse to support a least-squares solution, and transitions back to the candidate diversity update process, waiting for the next set of new candidates $y'_m$ and $u'_m$ to improve the source diversity.

If the source range $r_m$ is greater than the predetermined fraction of $y_0$, i.e., $r_m > TH_1 \cdot y_0$, and the source diversity $d_m$ is greater than the predetermined threshold of $d_{m,max}$, i.e., $d_m > TH_2 \cdot d_{m,max}$, then the matrix condition test process 54 proceeds to check the determinant of the 3×3 matrix $U_m^T U_m$. If the absolute value of the determinant is less than a predetermined small positive threshold $TH_3$, i.e., $\mathrm{abs}[\det(U_m^T U_m)] \leq TH_3$, where $\mathrm{abs}(\bullet)$ denotes the absolute value of a quantity, and $\det(\bullet)$ denotes the determinant of a square matrix, then $U_m^T U_m$ is close to a noninvertible matrix, the matrix condition test process again transitions back to the candidate diversity update process. Otherwise, the matrix condition test process regards the modified source matrix $U_m$ as a well-conditioned source matrix, and the modified source vector $Y_m$ as a well-conditioned source vector, both of which are sufficiently diverse and well-conditioned to support a least-squares solution, and transitions to the pseudo-inverse solution process.

Selection of thresholds $TH_1$, $TH_2$ and $TH_3$ is often application-dependent.

Following the definition of the source diversity $d_m$ in (34), its magnitude may change over a wide range from iteration to iteration. Therefore, it may be appropriate to use an alternate source diversity $d_m$ in place of the source diversity derived from equation (34), such as:

$$d_m = \sum_{i=1}^{N_D-1} \log_2(y_{i+1} - y_i) \tag{42}$$

As a result, equation (36) is replaced by:

$$d_m'' = \log_2(y_2 - y_1) + \log_2(y_3 - y_2) + \ldots + \log_2(y_m' - y_{i-1}) + \log_2(y_{i+1} - y_m') + \ldots + \log_2(y_{N_D} - y_{N_D-1}). \tag{43}$$

And equation (41) is replaced by:

$$d_{m,max} = (N_D-1) \cdot [\log_2(r_m) - \log_2(N_D-1)]. \tag{44}$$

In this case, alternate thresholds and rules may be used accordingly to perform the matrix condition test.

Pseudo-Inverse Solution

With continued reference to the embodiment of FIG. 10, the pseudo-inverse solution process 56 extracts the solution vector $\xi_m$ by applying a Moore-Penrose generalized matrix inverse to the well-conditioned source matrix $U_m$ and the well-conditioned source vector $Y_m$:

$$\xi_m = (U_m^T U_m)^{-1} \cdot (U_m^T Y_m) \tag{45}$$

The induction motor inductance parameters, e.g., the stator inductance $L_S$ and the total leakage factor $\sigma$, are calculated from this solution vector. For example, the stator inductance $L_S$ is calculated either from the first element of the solution vector via $L_S = 1/\xi_{m,1}$, in some preferred embodiments, or from the second and third elements of the solution vector via $L_S = \xi_{m,3}/\xi_{m,2}$. The total leakage factor $\sigma$ is calculated either from the first and third elements of the solution vector via $\sigma = \xi_{m,1} \cdot \xi_{m,3}$, in some preferred embodiments, or from the second element of the solution vector via $\sigma = \xi_{m,2}$.

Once the pseudo-inverse solution process 56 is executed, the control flow is transitioned to the terminus of the whole least-square solver. In general, the induction motor inductance parameters are stored. However, it is possible to keep producing pseudo-inverse solution each time a qualified set of new candidates $y'_m$ and $u'_m$ is available. Through continued application of the techniques described in the least-squares solver, the final induction motor inductance parameters are iteratively refined with increased robustness and accuracy.

While particular embodiments and applications of the present disclosure have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method for estimating at least one motor inductance parameter of a polyphase induction motor, the method comprising:
receiving measurements indicative of at least one voltage and at least one current associated with the induction motor;
converting the voltage measurements to discrete-time voltage samples and the current measurements to discrete-time current samples;
determining a complex voltage from the discrete-time voltage samples and a complex current from the discrete-time current samples;
receiving motor nameplate data associated with the motor;
determining an instantaneous rotor speed of the motor, the determining the instantaneous rotor speed including calculating, via at least one processor, an instantaneous rotor slot harmonic frequency extracted from the complex current with respect to an instantaneous fundamental frequency extracted from the complex voltage;
determining an instantaneous reactive power of the induction motor according to a function that includes the complex voltage and the complex current;
determining at least one motor inductance parameter based, at least in part, upon the motor nameplate data and the instantaneous reactive power; and
storing an indication of the at least one motor inductance parameter in at least one memory.

2. The method of claim 1, wherein the at least one motor inductance parameter includes a stator inductance of the induction motor, a total leakage factor of the induction motor, or both.

3. The method of claim 2, wherein the determining the stator inductance, the total leakage factor, or both, includes a least-squares solver applying a pseudo-inverse solution to a well-conditioned source matrix along with a well-conditioned source vector.

4. The method of claim 1, wherein the motor nameplate data includes a rated voltage of the motor, a rated current of the motor, a number of rotor slots of the motor, a rated slip of the motor, a rated power factor of the motor, a rated fundamental frequency of the motor, or a rated speed of the motor, or any combination thereof.

5. The method of claim 1, wherein the motor nameplate data includes a rated fundamental frequency of the motor, and wherein the function for determining the instantaneous reactive power further includes the rated fundamental frequency.

6. The method of claim 1, wherein the voltage measurements are taken either from at least two phases with respect to a third phase or from the at least two phases with respect to a voltage reference point, and wherein the current measurements are taken from the at least two phases.

7. A method for estimating at least one motor inductance parameter of a polyphase induction motor, the method comprising:
receiving measurements indicative of at least one voltage and at least one current associated with the induction motor;
converting the voltage measurements to discrete-time voltage samples and the current measurements to discrete-time current samples;
determining a complex voltage from the discrete-time voltage samples and a complex current from the discrete-time current samples;
receiving motor nameplate data associated with the motor;
determining an instantaneous rotor speed of the motor;

determining an instantaneous reactive power of the induction motor according to a function that includes the complex voltage and the complex current, the determining the instantaneous reactive power being carried out by an induction motor inductance estimator comprising at least one linear-phase band-pass filter, a numerical integrator, a numerical differentiator, and at least one latency compensator;

determining at least one motor inductance parameter based, at least in part, upon the motor nameplate data and the instantaneous reactive power; and storing an indication of the at least one motor inductance parameter in at least one memory.

8. The method of claim 7, wherein the determining the instantaneous reactive power comprises:

attenuating, via the at least one linear-phase band-pass filter, out-of-band interference and noise; and introducing, via the at least one linear-phase band-pass filter, a uniform time delay to all frequency signals within a frequency range.

9. The method of claim 7, wherein the at least one linear-phase band-pass filter includes a voltage-controlled oscillator, a complex conjugate, a generalized linear-phase low-pass filter, and a latency compensator.

10. The method of claim 9, wherein the generalized linear-phase low-pass filter has a cutoff frequency, the cutoff frequency being configured to accommodate periodic pulsations in the complex current.

11. The method of claim 9, wherein the latency compensator compensates for a group delay and synchronizes a complex exponential signal and a complex baseband signal to the same epoch.

12. The method of claim 7, wherein the determining the instantaneous reactive power further comprises:

determining, via the numerical integrator, a complex stator flux linkage with a zero initial condition; and determining, via the numerical differentiator, an approximate of a continuous-time derivative of a complex fundamental current.

13. The method of claim 7, wherein the determining the instantaneous reactive power further comprises:

compensating, via the at least one latency compensator, for one or more time delays introduced by the at least one linear-phase band-pass filter, the numerical integrator, or the numerical differentiator of the induction motor inductance estimator, or any combination thereof.

14. A method for estimating at least one motor inductance parameter of a polyphase induction motor, the method comprising:

receiving measurements indicative of at least one voltage and at least one current associated with the induction motor;

converting the voltage measurements to discrete-time voltage samples and the current measurements to discrete-time current samples;

determining a complex voltage from the discrete-time voltage samples and a complex current from the discrete-time current samples;

receiving motor nameplate data associated with the motor;

determining an instantaneous rotor speed of the motor;

determining an instantaneous reactive power of the induction motor according to a function that includes the complex voltage and the complex current;

determining, via at least one processor, at least one motor inductance parameter based, at least in part, upon the motor nameplate data and the instantaneous reactive power; and storing an indication of the at least one motor inductance parameter in at least one memory, wherein the determining the at least one motor inductance parameter includes:

constructing a sorted source matrix and a sorted source vector;

evaluating a source diversity based on the sorted source vector;

modifying the sorted source matrix and the sorted source vector to have an improved source diversity;

evaluating at least one condition associated with the modified source matrix and the modified source vector;

determining a well-conditioned source matrix and a well-conditioned source vector based upon the at least one condition;

extracting a solution vector by applying a Moore-Penrose generalized matrix inverse to the well-conditioned source matrix and the well-conditioned source vector; and determining the at least one motor inductance parameter from the solution vector.

15. The method of claim 14, wherein the evaluating the condition of the modified source matrix includes:

comparing a source range of the sorted source vector to a predetermined fraction of a value that is a function of the motor nameplate data;

comparing a source diversity of the sorted source vector to a predetermined threshold of a maximum possible source diversity; and comparing the absolute value of a determinant of the sorted source vector to a predetermined small positive threshold.

16. The method of claim 14, wherein the source diversity is a product of differences between adjacent elements in the sorted source vector.

17. The method of claim 14, wherein the modifying the sorted source matrix and the sorted source vector to have an improved source diversity includes:

constructing an augmented source vector;

creating a remnant vector from the augmented source vector;

evaluating a source diversity based on the remnant vector;

comparing the source diversity based on the remnant vector to the source diversity based on the sorted source vector;

creating the modified source vector; and creating the modified source matrix.

18. One or more machine-readable non-transitory storage media including instructions which, when executed by one or more processors, cause the one or more processors to perform operations associated with a polyphase induction motor monitoring system, the operations comprising:

receiving measurements indicative of at least one voltage and at least one current associated with a polyphase induction motor;

converting the voltage measurements to discrete-time voltage samples and the current measurements to discrete-time current samples;

determining a complex voltage from the discrete-time voltage sample and a complex current from the discrete-time current sample;

receiving motor nameplate data;

determining an instantaneous rotor speed, the determining the instantaneous rotor speed including calculating an instantaneous rotor slot harmonic frequency extracted from the complex current with respect to an instantaneous fundamental frequency extracted from the complex voltage;
determining an instantaneous reactive power of the induction motor; and
determining a stator inductance, a total leakage factor, or both of the induction motor based, at least in part, upon the motor nameplate data and the instantaneous reactive power.

19. A method for estimating one or more inductance parameters of a line-connected squirrel-cage polyphase induction motor, the method comprising:
measuring voltages and currents of the induction motor;
converting, via analog-to-digital converters, the measured voltages and currents to discrete-time voltage samples and discrete-time current samples, respectively;
synthesizing a complex voltage from at least the discrete-time voltage samples;
synthesizing a complex current from at least the discrete-time current samples;
acquiring motor nameplate data;
storing the acquired motor nameplate data;
detecting an instantaneous rotor speed, the detecting the instantaneous rotor speed including calculating, via at least one processor, an instantaneous rotor slot harmonic frequency extracted from the complex current with respect to an instantaneous fundamental frequency extracted from the complex voltage;
calculating, via an induction motor inductance estimator, an instantaneous reactive power and a plurality of intermediate quantities of the induction motor; and
storing a stator inductance and a total leakage factor of the induction motor.

* * * * *